United States Patent [19]
Paul et al.

[11] 4,253,161
[45] Feb. 24, 1981

[54] GENERATOR/SHIFT REGISTER/DETECTOR FOR CROSS-TIE WALL MEMORY SYSTEM

[75] Inventors: Maynard C. Paul, Minneapolis; David S. Lo, Burnsville; Ernest J. Torok, Minneapolis, all of Minn.

[73] Assignee: Sperry Corporation, New York, N.Y.

[21] Appl. No.: 85,163

[22] Filed: Oct. 15, 1979

[51] Int. Cl.³ .............................................. G11C 19/08
[52] U.S. Cl. ...................................... 365/87; 365/172
[58] Field of Search ......................... 365/87, 171, 172

[56] References Cited

U.S. PATENT DOCUMENTS

| 4,075,612 | 2/1978 | Johnson et al. | 365/171 |
| 4,100,609 | 7/1978 | Schwee et al. | 365/87 |
| 4,161,789 | 7/1979 | Torok et al. | 365/87 |
| 4,198,686 | 4/1980 | Nelson et al. | 365/87 |

OTHER PUBLICATIONS

IEEE Transactions on Magnetics–vol. Mag.-12, No. 6, Nov. 1976, pp. 608–613.
Journal of Applied Physics–49(3), Mar. 1978, pp. 1831-1833, 18-28-1830.

Primary Examiner—James W. Moffitt
Attorney, Agent, or Firm—Kenneth T. Grace; William E. Cleaver; Marshall M. Truex

[57] ABSTRACT

Disclosed is a cross-tie wall memory system for the generating, propagating and detecting of binary data represented by the presence or absence of cross-tie, Bloch-line pairs along a cross-tie wall in a thin magnetic data track. The system includes a three-level shift register structure comprised of the following layers: first and second substantially similar, serrated-edged current conductive striplines and a serrated-edged thin magnetic layer data track. The shift register is terminated on one end by a cross-tie, Bloch-line pair generator and on the other end by a cross-tie detector. A data word is stored in the data track between the generator and the detector and is shifted through the detector for readout of the stored data word. The first and second serrated-edged striplines are formed of alternate wide-narrow portions with the wide portion of one stripline oriented above/below the narrow portion of the other stripline. Current signals alternatively coupled to the first and second striplines generate drive fields of differing intensities in the plane of the inductively coupled data track for propagating the cross-tie, Bloch-line pairs therealong.

7 Claims, 15 Drawing Figures

GENERATOR/SHIFT REGISTER/DETECTOR FOR CROSS-TIE WALL MEMORY SYSTEM

BACKGROUND OF THE INVENTION

The propagation of inverted Neel wall sections in a serial access memory system was proposed by L. J. Schwee in the publication "Proposal On Cross-tie Wall and Bloch-line Propagation In Thin Magnetic Films," IEEE Transactions on Magnetics, MAG 8, No. 3, pages 405–407, September 1972. Such a memory system utilizes a ferromagnetic film of approximately 81% Ni-19% Fe approximately 350 Angstroms (Å) thick in which cross-tie walls can be changed to Neel walls and Neel walls can be changed to cross-tie walls by applying appropriate fields. Associated with the cross-tie wall is a section of inverted Neel wall that is bounded by a cross-tie wall on one end and a Bloch-line on the other end.

In such a cross-tie wall memory system, information is entered at one end of the serial access memory system by the generation of an inverted Neel wall section, formed by a cross-tie on one side and a Bloch-line on the other, that is representative of a stored binary 1 or of a non-inverted Neel wall section (i.e., the absence of a cross-tie and Bloch-line pair) that is representative of a stored binary 0. Such information is moved or propagated along the cross-tie wall by the successive generation (and then the selective annihilation) of inverted Neel wall sections at successive memory cells along the cross-tie wall. In the D. S. Lo, et al, U.S. Pat. No. 3,906,466 there is disclosed a propagation circuit for the transfer of inverted Neel wall sections at successive memory cells along the cross-tie wall. In the L. J. Schwee U.S. Pat. No. 3,868,659 and in the publication "Cross-tie Memory Simplified by the Use of Serrated Strips," L. J. Schwee, et al, AIP Conference Proceedings, No. 29, 21st Annual Conference on Magnetism and Magnetic Materials, 1975, published April 1976, pages 624–625, and in the publication "Cross-Tie/-Bloch-Line Detection," G. J. Cosimini, et al, AIP Conference Proceedings, No. 3, 23rd Annual Conference on Magnetism and Magnetic Materials, 1978, published March 1978, pages 1828–1830, there have been published some more recent results of the further development of cross-tie wall memory systems.

In prior art cross-tie wall memory systems, the magnetic film that functions as the storage medium has the property of uniaxial anisotropy provided by its easy axis induced magnetic fields, which easy axis is generated in the magnetic film during its formation in the vapor deposition process. This easy axis provides a magnetic field induced anisotropy which constrains the generation of the cross-tie wall along and parallel to the easy axis. In the above L. J. Schwee, et al, AIP publication there are proposed serrated strips of Permalloy film, about 350 Angstroms (A) in thickness and 10 microns ($\mu$m) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This generates two large domains that are separated by a Neel or cross-tie wall that is formed along the centerline of the strip. Cross-ties are energetically more stable at the necks of the serrated edges while Bloch-lines are energetically more stable in the potential wells between adjacent necks.

This serrated strip configuration, because of the contour of the opposing edges of the strip, provides the means whereby the cross-tie, Bloch-line pairs are structured at predetermined memory sections along the strip. However, because prior art strips have field induced uniaxial anisotropy imparted during deposition, such strips cannot be utilized to permit the use of nonlinear, i.e., curved, data tracks, which curved data tracks are essential to the configuration of cross-tie wall memory systems of large capacity or of digital logic function capabilities. In the L. H. Johnson, et al, U.S. Pat. No. 4,075,612 there is disclosed a design of the edge contour of a film strip of, e.g., Permalloy film of approximately 350 A in thickness and approximately 10 $\mu$m in width. The edge contours are mirror images, one of the other, of asymmetrical, repetitive patterns of rounded edge portions. The edge contour of each opposing pair of rounded edge portions is substantially in alignment with the natural contour of the magnetization that is oriented around a Bloch-line, which Bloch-line is positioned along the cross-tie wall that is oriented along the geometric centerline of the film strip. The neck or narrowest point of the edge contour between adjacent rounded edge portions functions to structure the static or rest position of the associated cross-tie of the cross-tie, Bloch-line pair.

In the M. C. Paul, et al, U.S. Pat. No. 4,130,888 there is disclosed a cross-tie wall memory system and in particular a data track therefor that is formed of a strip of magnetic material having substantially zero magnetic field induced anisotropy. The data-track-defining-strip of isotropic material utilizes its shape, i.e., its edge contour induced, anisotropy to constrain the cross-tie wall within the planar contour and along the centerline of the film strip. Accordingly, the cross-tie wall is constrained to follow the path defined by the magnetic film strip which path may be configured into a major loop, or circular data track, configuration for large capacity memory storage.

In the E. J. Torok U.S. Pat. Nos. 4,080,591 and 4,075,613 there is utilized the data-track-defining-strip of isotropic magnetic film of the hereinabove referenced M. C. Paul, et al, patent to form a replicator of and a logic gate for cross-tie, bloch-line pairs. The replicator is utilized as a magnetic switch or gate to selectively transfer cross-tie, Bloch-line pairs between merging, overlapping data tracks. This permits the configuration of a plurality of continuous data tracks into a major-loop, minor-loop configuration for a large capacity memory system. The logic gate is utilized as a magnetic switch to selectively perform the logic OR function or the logic AND function upon two merging, overlapping data tracks.

SUMMARY OF THE INVENTION

In the cross-tie wall memory system of the present invention there is provided a shift register for shifting cross-tie, Bloch-line pairs therealong through a plurality of memory cells consisting of a transfer section and a store section. The shift register is terminated on one end by a cross-tie, Bloch-line pair generator, for selectively coupling cross-tie, Bloch-line pairs into the shift register, and on the other end by a detector for detecting when a cross-tie has been entered therein from the shift register.

The generator/shift register/detector assembly is fabricated in three superposed layers: a first serrated-edged current conductive stripline; a serrated-edged thin magnetic layer that forms the data track along the geometric centerline of which is formed and structured the cross-tie wall, and a second serrated-edged current conductive stripline. Both the first and the second serrated-edged current conductive striplines are of similar planar conformation having triangular-shaped, mirror-image edge contours of alternating width peaks but of similar valleys or necks therebetween. The serrated-edged thin film magnetic layer has a planar conformation formed of similar diameter overlapping circular disks. The diameter of the disks is less than the width of the associated first and second stripline peaks while the overlapping disks form necks at the joins of their circumferences for forming points of minimum energy states for the cross-ties while the centers of the disks form points of minimum energy states for the Bloch-lines.

The shift register is terminated on one end by a cross-tie, Bloch-line pair generator and on the other end by a cross-tie detector. Electronic circuitry controls the drive current signals to the first and second serrated-edged striplines for generating the necessary fields for the propagation of the cross-tie, Bloch-line pairs along the serrated-edged data track, to the generator to selectively generate, or not, cross-tie, Bloch-line pairs, and to the detector to detect the presence, or not, of a cross-tie, all in synchronism.

BRIEF DESCRIPTION OF THE DRAWINGS

FIGS. 7a through 7i are schematic illustrations illustrating the generate/propagate/detect operations of a cross-tie, Bloch-line pair in the system of FIG. 1 as effected by the signals of the timing diagram of FIG. 4.

DESCRIPTION OF THE PREFERRED EMBODIMENT

Figure 1:
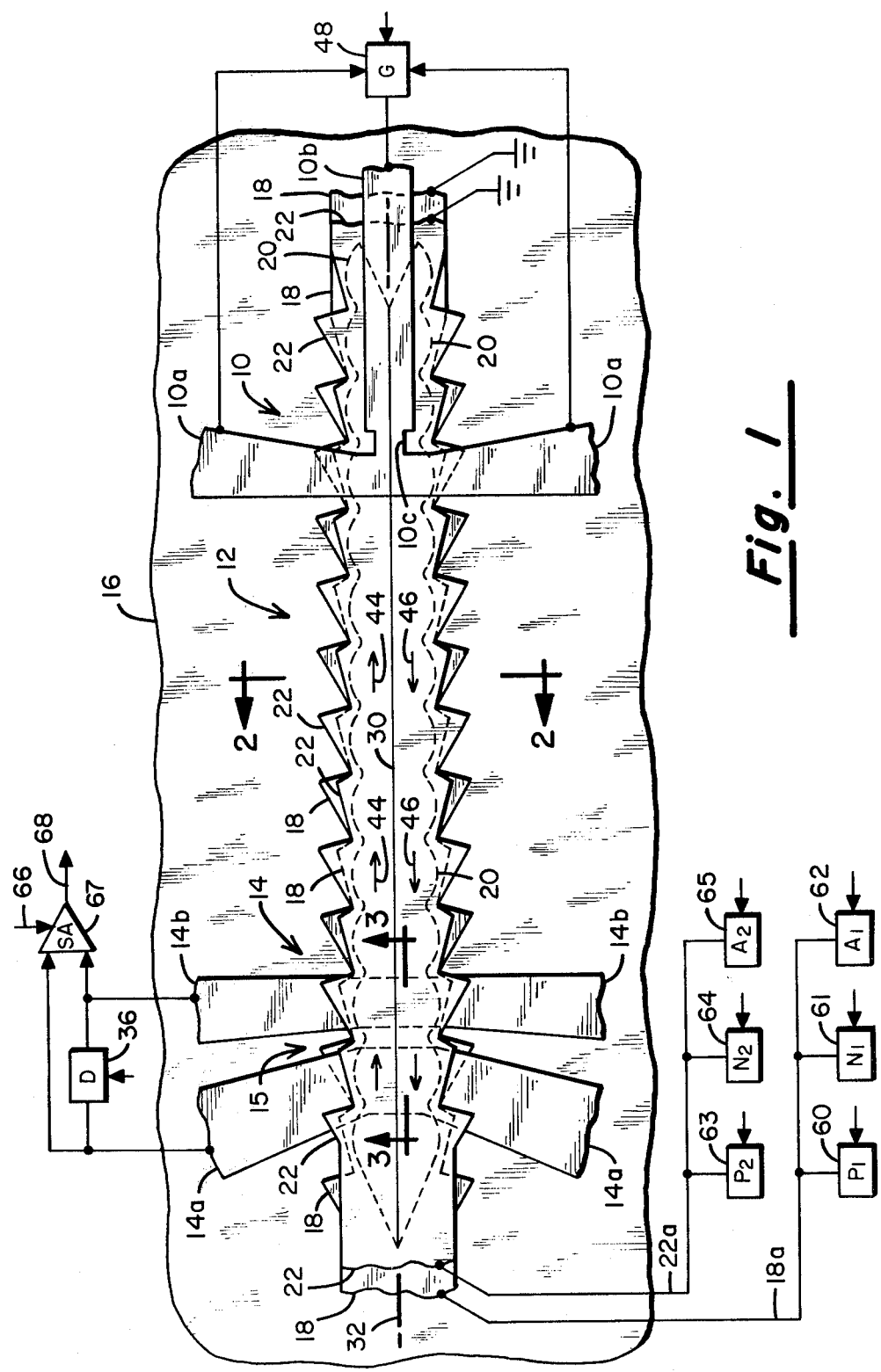
FIG. 1 is a schematic illustration of a portion of a cross-tie wall memory system illustrating, in detail, the generator/shift register/detector of the present invention.

FIG. 1 is an illustration of a portion of a cross-tie wall memory system into which the generator 10, shift register 12, and the detector 14 of the present invention have been incorporated.

Figure 2:
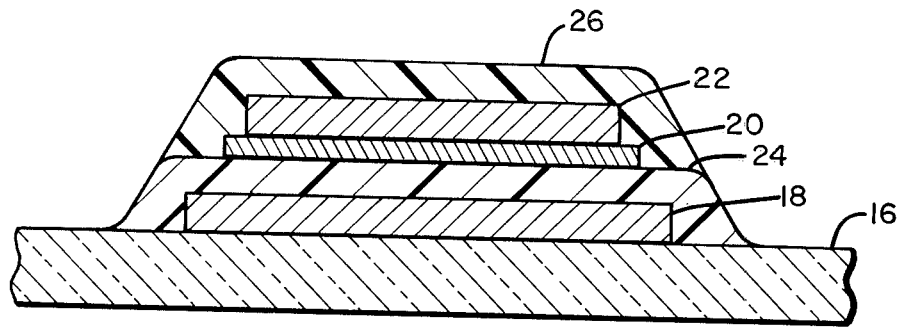
FIG. 2 is an illustration of a cross-section of the memory plane of FIG. 1 taken along line 2—2 thereof illustrating the stacked, superposed elements of FIG. 1.

FIG. 2 is an illustration of a cross-section of the memory plane of FIG. 1 taken along line 2—2 thereof for the purpose of illustrating the stacked, superposed elements of FIG. 1. The memory system of FIG. 1 includes a non-magnetizable, e.g., glass or silicon, substrate member 16 having the following active members arranged in a stacked, superposed integral assembly: conductive, e.g., gold, serrated-edged stripline 18; magnetizable, e.g., NiFe, serrated-edged data track 20; and conductive, e.g., gold, serrated-edged stripline 22. Not illustrated in FIG. 1 or FIG. 2 are: a thin adhesive layer of, e.g., chromium, that may be affixed to the top and/or the bottom surfaces of the metallic layers for ensuring an integral assembly of the metallic layers with the adjacent metallic or insulating layers. Illustrated in FIG. 2 is a thin, smoothing and insulating layer 24 of, e.g., SiO. Between the current-conducting striplines 18 and 22, and superposed this entire assembly and affixed to the top surface thereof, there may be provided an additional, e.g., SiO, sealing and insulating layer 26.

As is well known, data track 20 when effected by the proper drive fields establishes a cross-tie wall 30 along its geometric centerline which is substantially aligned with its longitudinal axis, identified as line 32 of FIG. 1. Preferably the film strip is isotropic, i.e., has substantially zero magnetic field induced anisotropy, and utilizes its shape, i.e., its edge contour, to constrain the cross-tie wall within the planar contour of and along the longitudinal axis 32. In the present invention, as illustrated in FIG. 1, data track 20 has a planar conformation that is defined by a series of overlapping circular disks, the joins of their circumferences forming necks that generate minimum energy states for the cross-ties while the centers of the disks form minimum energy states for the Bloch-lines.

In the present invention, as illustrated in the embodiment of FIG. 1, striplines 18 and 22 are configured into similar serrated-edged drive lines, the serrated-edged contours of which are comprised of alternating triangular-shaped portions, in which the height of the wide triangular portion is approximately twice the height of the narrow triangular portion. The necks between the triangular-shaped portions of striplines 18 and 22 are substantially centered about and in line with the narrow portions or necks of data track 20. For purposes of the present invention, the alternate, every other, narrow portions or necks of data track 20 and the associated narrow portions or necks of striplines 18 and 22, beginning at generator segment 10c of generator 10, are defined as a store segment, while the other alternate narrow portions or necks of data track 20 and the associated narrow portions or necks of striplines 18 and 22 are defined as a transfer segment—see the D. S. Lo, et al, U.S. Pat. No. 3,906,466—both combining to comprise a memory cell, a plurality of which are aligned along the shift register 12 formed of data track 20 and striplines 18 and 22 of FIG. 1. Thus, generator 10 of FIG. 1 is centered about a store segment while detector 14 is centered about a transfer segment.

Figure 3:
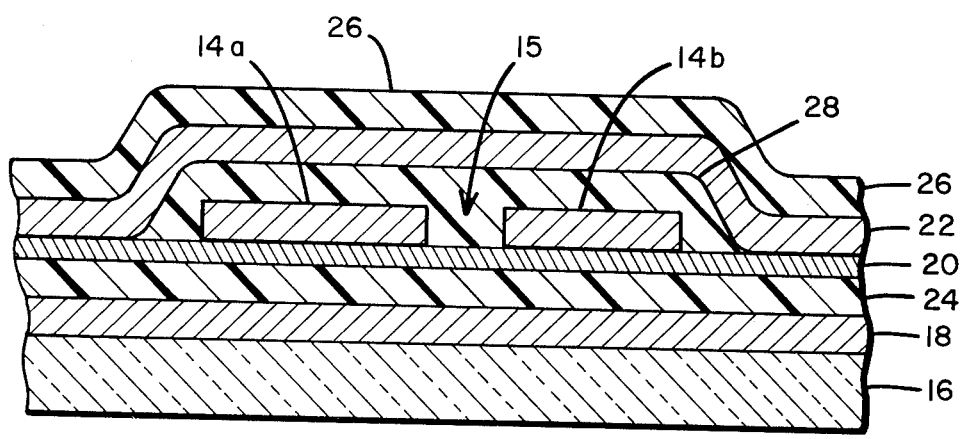
FIG. 3 is an illustration of a cross-section of the memory plane of FIG. 1 taken along line 3—3 thereof illustrating the stacked, superposed elements of FIG. 1 in the area of the detector.

With particular reference to FIG. 3, there is presented a cross-sectional view of FIG. 1 taken along line 3—3 in the area of gap 15. FIG. 3 illustrates that this stacked, superposed relationship includes the following listed successive layers, with the adhesive layers not illustrated for clarity:

glass substrate 16—0.50 mm thick
chromium adhesive layer—100 A thick
gold stripline 18—1500 A thick
chromium adhesive layer—100 A thick
SiO insulative layer 24—12,500 A thick Permalloy data track 20—approximately 81% Ni-19% Fe, 350 A thick
chromium adhesive layer—100 A thick
gold detector arms 14a, 14b—1000 A thick
chromium adhesive layer—100 A thick
SiO insulative layer 28—12,500 A thick
chromium adhesive layer—100 A thick
gold stripline 22—1000 A thick
SiO sealing layer 26—12,500 A thick.

With reference back to FIG. 1, there is illustrated a shift register 12, comprised of serrated-edged stripline 18, serrated-edged data track 20 and serrated-edged stripline 22. Shift register 12 is terminated at one end by generator 10, comprised of conductive element 10a extending across shift register 12, followed by a narrow portion 10c, in which the cross-tie of the cross-tie, Bloch-line pair is generated, and a terminating wide end portion 10b. Shift register 12 is terminated on the other end by detector 14, consisting of conductive elements 14a and 14b extending across shift register 12. Following element 14b and separated therefrom, conductive element 14a forms the other electrode, with element 14b of detector 14, across which separation or gap 15 the presence or absence of the cross-tie is detected magneto-resistively.

With particular reference to FIG. 4 and FIGS. 7a through 7i, there are presented illustrations of a timing diagram and the resultant generation, propagation and detection of cross-tie, Bloch-line pairs in the cross-tie wall memory system of FIG. 1.

The propagation of the cross-tie, Bloch-line pairs along data track 20 under the influence of the drive fields provided by the coupling of the proper current drive signals to stripline 18 and stripline 22 is in the well-known two-step manner. This requires a store-transfer sequence of the propagation of the cross-tie and the Bloch-line within a memory cell—see the D. S. Lo, et al, U.S. Pat. No. 3,906,466. In this method of propagation, the cross-tie wall is initially formed along the geometric centerline of the data track by an in-plane field normal to the longitudinal axis of the data track. The circular serrated edges of the data track, when the in-plane field is removed, cause the magnetization M within the data track to collapse forming two anti-parallel magnetic domains on opposite sides of the cross-tie wall.

The combination of the pattern of the circular, serrated edges of the data track and the triangular, serrated edges of the propagate drive lines, i.e., the wide-narrow edge pattern of striplines 18 and 22, establishes or structures the memory cells along the data track. To propagate the cross-tie, Bloch-line pairs in the well-known manner, each memory cell is required to include a store segment and a transfer segment, the order or names of which are purely arbitrary. These two segments are required due to the mechanism whereby cross-tie, Bloch-line pairs are propagated along a data track.

Initially, a cross-tie, Bloch-line pair is established in a first store segment defined by the length of one serrated edge along the data track in which the cross-tie is oriented between the necks formed by the narrow width or portion of the data track, and the associated Bloch-line is oriented between the two adjacent narrow portions and on the downstream side of the associated cross-tie. Next, a drive field separates the Bloch-line from the associated cross-tie, "pushing" the Bloch-line downstream into the adjacent transfer segment leaving the associated cross-tie in its initial position. Next, a nucleate drive field generates a cross-tie, Bloch-line pair between the separated cross-tie and Bloch-line. Next, an annihilate drive field annihilates the cross-tie, Bloch-line pair that is resident in the store segment effectively transferring the initial cross-tie, Bloch-line pair from the store segment into the downstream transfer segment. This sequence is repeated so that after two consecutive push-nucleate-annihilate cycles the cross-tie, Bloch-line pair has been propagated from a store segment, through a transfer segment of the same memory cell and into the store segment of the next adjacent downstream memory cell.

In the illustrated embodiment of FIG. 1, the narrow portions or necks of striplines 18 and 22 formed by their adjacent triangular serrated-edges and the narrow portions or necks of data track 20 formed by its adjacent overlapping circular-disk forming serrated-edges define the minimum energy states for the propagating cross-ties while the centers of the overlapping circular disks define the minimum energy states for the propagating Bloch-lines.

Figure 5:
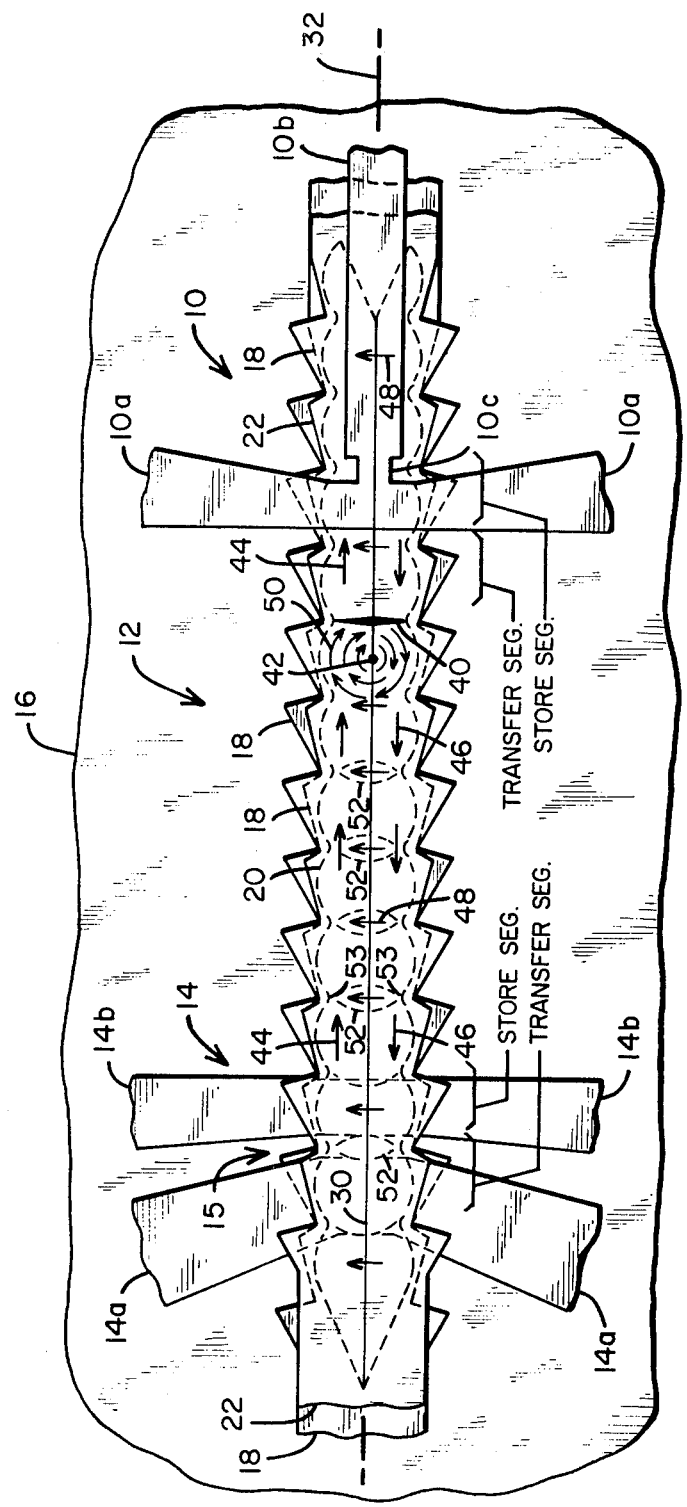
FIG. 5 is an illustration of the magnetization orientation in the serrated-edged data track and in particular in the area of the cross-tie wall and a cross-tie, Bloch-line pair therealong.
Figure 6:
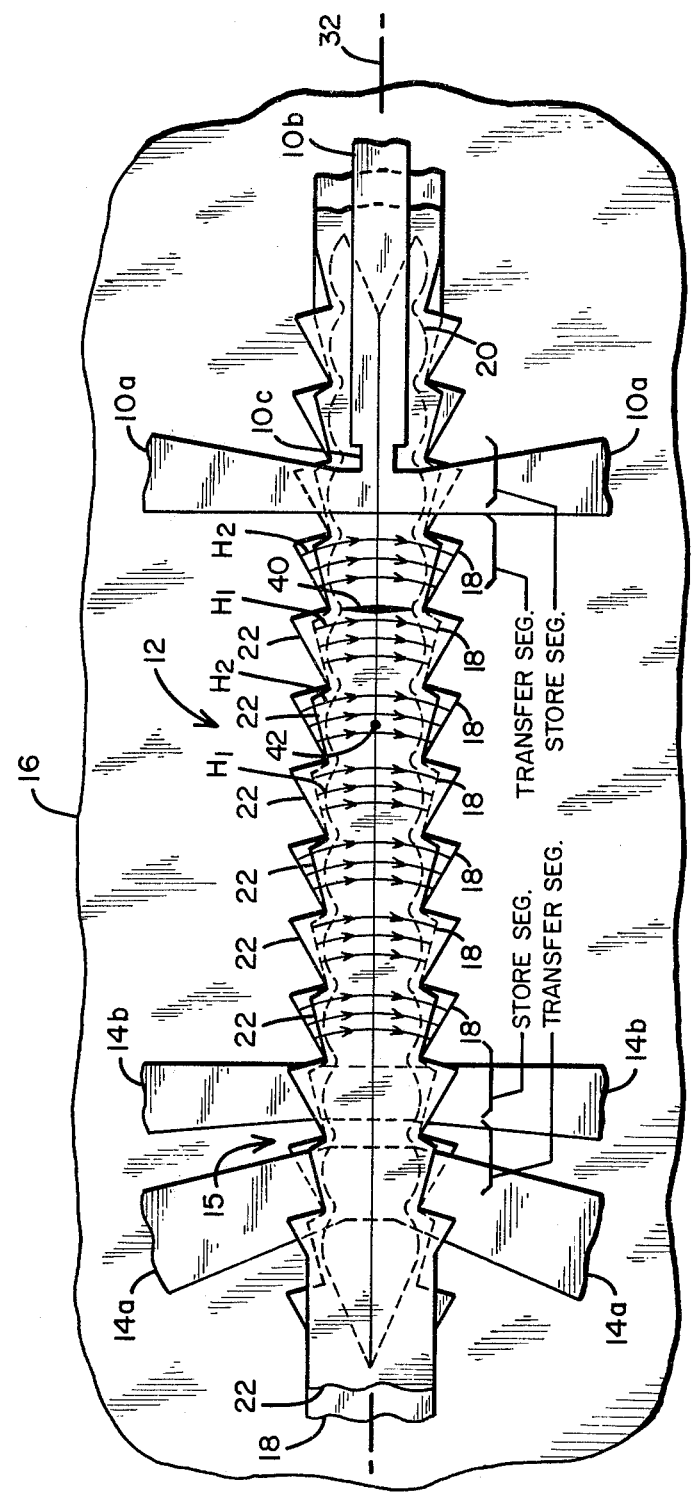
FIG. 6 is an illustration of the drive fields $H_1$ and $H_2$ of differing intensity due to a drive current signal coupled to a serrated-edged drive line of FIG. 1 and their effects upon the cross-tie, Bloch-line pair of FIG. 5.

With respect to FIGS. 5 and 6 there are illustrated the magnetization orientation within data track 20 and in particular with respect to a cross-tie 40, Bloch-line 42 pair and the orientation and effect of the drive fields generated by a drive current signal coupled to one of the striplines 18 or 22. In FIG. 5, data track 20 is shown as having a cross-tie wall 30 established along its longitudinal axis 32. Cross-tie wall 30 separates two anti-parallel magnetic domains in data track 20: a magnetic domain above cross-tie wall 30 that is oriented to the right as indicated by arrows 44; and a magnetic domain below cross-tie wall 30 that is oriented to the left as indicated by arrows 46. The magnetization within cross-tie wall 30 is indicated by the upwardly directed arrows 48 while the magnetization about Bloch-line 42 is indicated by the circularly directed arrows 50 providing between cross-tie 40 and Bloch-line 42 the inverted Neel wall section as indicated by the downwardly directed arrows 50 therebetween.

As indicated in FIG. 5 the narrow portion 10c of generator 10, at the narrow portions or widths across striplines 18 and 22 and data track 20, defines the store segment of the initial memory cell along shift register 12 while the next adjacent downstream narrow portion of data track 20 defines the associated transfer segment. Also illustrated is that the gap 15 of detector 14 is positioned or centered about the transfer segment of the last memory cell along shift register 12. FIG. 5 also illustrates that data track 20 is formed by a series of overlapping circular disks 52 that at the joins 53 of their overlapping circumferences form the positions along data track 20 of minimum energy states for the propagating cross-ties while the centers of the circular disks 52 form the positions along data track 20 of minimum energy states for the propagating Bloch-lines. This configuration of data track 20 is somewhat similar to the serrated-edged data track of the L. H. Johnson, et al, U.S. Pat. No. 4,075,612.

In U.S. Pat. No. 4,075,612 there is illustrated the serrated-edged magnetic data track of the L. J. Schwee, et al, Publication "Cross-tie Memory Simplified by the Use of Serrated Strips," AIP Conference Proceedings, No. 29, 21st Annual Conference on Magnetism and Magnetic Materials, 1975, published April 1976, pages 624–625. In the present invention conductive striplines 18 and 22 have similar serrated-edge conformation; however, the serrated-edge conformation in striplines 18 and 22 is used to provide a shaped magnetic field of a controllable but variable intensity along the stripline length, acting upon the data track for propagation as well as for generating the cross-tie wall in the data track, not just to generate the cross-tie wall in the data track upon the collapse of the externally applied field, as does the serrated data track of Schwee, et al.

With respect to FIG. 6 there are illustrated the various magnetic field intensities and orientations in the plane of data track 20, due to a drive current signal being coupled to stripline 18. Note that in the illustrated embodiment striplines 18 and 22 have identically dimensioned conformations and are superposed along their longitudinal axes but are shifted one serrated-edge pattern along such longitudinal axes. As illustrated in FIGS. 1, 5 and 6, stripline 18 (and 22) is comprised of mirror-imaged serrated-edge patterns formed of triangular-shaped sections. Alternate triangular-shaped sections along stripline 18 are formed of triangles of a first lower height while the other alternate triangular-shaped sections along stripline 18 are formed of triangles of a second higher height. As the joins of the adjacent triangles are at the same distance from the centerline of stripline 18 and the apex of the different height triangles are at the same distance along the longitudinal axis of the stripline, the outside edges of the different height triangles are at different angles to the longitudinal axis of the stripline. These different angles and different heights, when stripline 18 is coupled by the appropriate drive current signal, generate drive fields, in the plane of data track 20, of different intensities and orientations.

In the larger area spanned by the larger-width triangles of stripline 18 there is generated a drive field $H_2$ while in the smaller area spanned by the smaller-width triangles of stripline 18 there is generated a drive field $H_1$ in which the relative field intensity of drive field $H_1$ is greater than that of drive field $H_2$;

$H_1 > H_2$.

This difference in relative drive field intensities in the transfer segment and store segment of the memory cells along shift register 12 is essential to the operation of the cross-tie memory system of the present invention. By alternatively selectively coupling the appropriate drive current signals to stripline 18 and then to stripline 22 the relative field intensities in the store segment and the transfer segment of each memory cell along shift register 12 are made alternatively relatively more intense and less intense, i.e., stronger and weaker, as a function of the driving stripline 18 or 22. This permits the two-step push-nucleate-annihilate sequence of operation using the shaped drive fields provided by the shaped-edged striplines 18 and 22.

With respect to FIG. 6, the relatively stronger Push drive field $H_1$ and the relatively weaker Push drive field $H_2$—field $H_1$ being directed between cross-tie 40 and Bloch-line 42 and field $H_2$ being directed outside of the cross-tie 40, Bloch-line 42 pair—provide the necessary relative field intensity variations along the cross-tie wall 30 (and longitudinal axis 32) of data track 20 of shift register 12 to produce the necessary downstream propagation of the Bloch-line during the Push cycle to enable the following Nucleate and Annihilate cycles to provide the desired two-step propagation sequence of operation.

Figure 4:
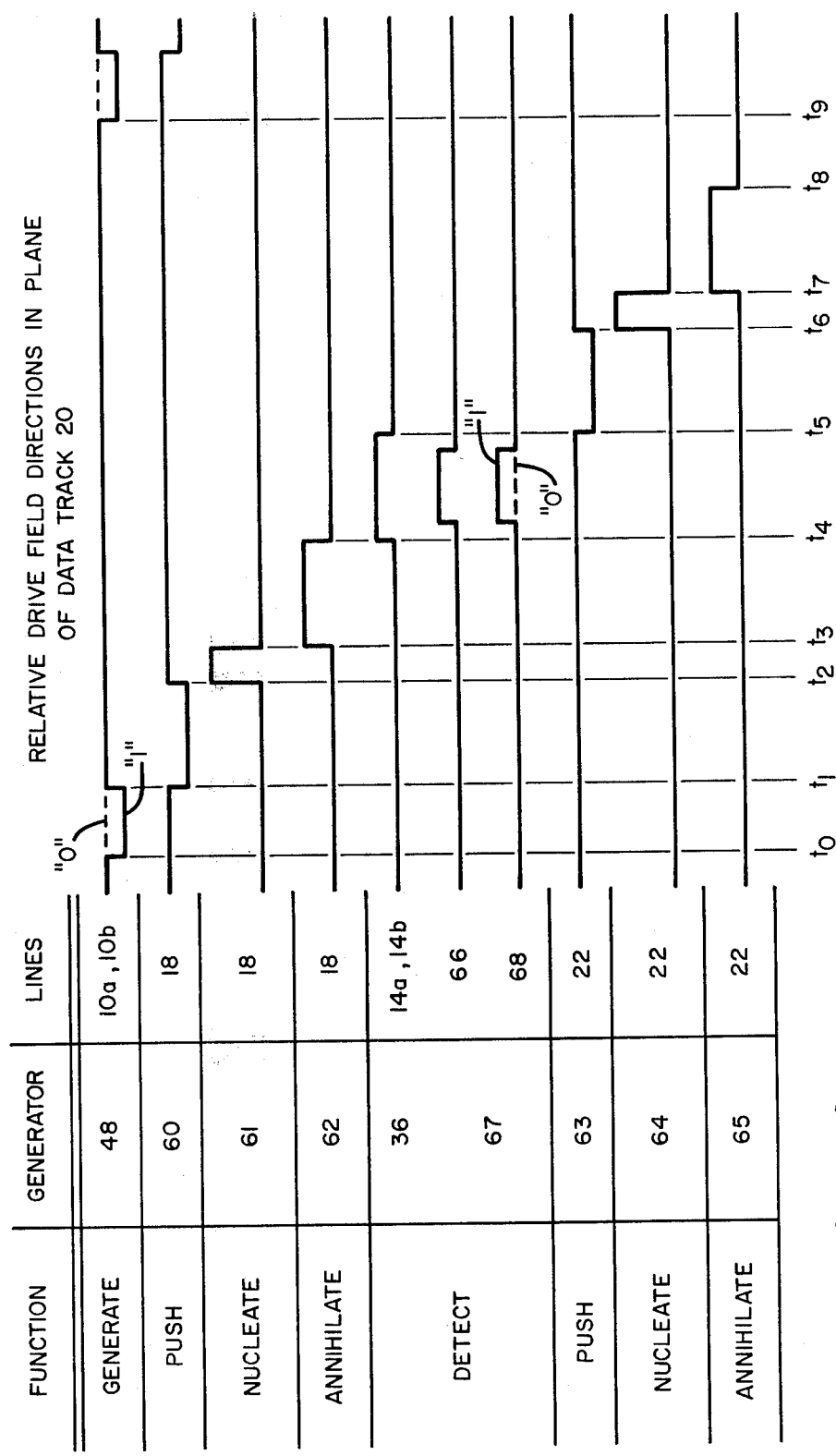
FIG. 4 is an illustration of an illustrative timing diagram for the operation of the cross-tie wall memory system of FIG. 1.
Figures 7A, 7B:
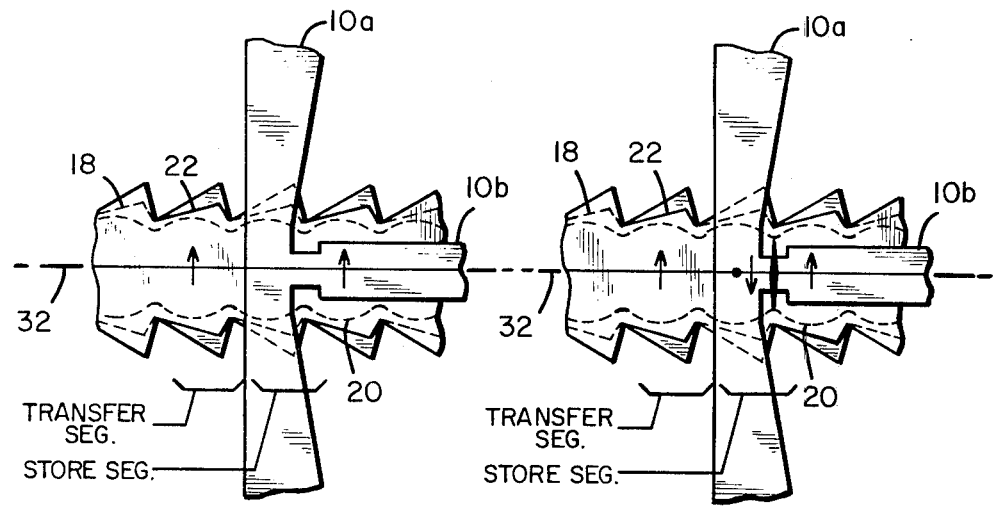

With respect to the timing diagram of FIG. 4, assume that prior to time $t_0$ the generator 10 of FIG. 1 is empty having no cross-tie, Bloch-line pair established therein. This is as indicated in FIG. 7a. Now, at a time $t_0$, generator 48 couples a Generate current signal to generator 10, via conductive elements 10a, 10b, generating a cross-tie, Bloch-line pair in generator 10. This is as illustrated in FIG. 7b. Note that generator 48 selectively couples the Generate current signal to generator 10 for the generation vel non of a cross-tie, Bloch-line pair within generator 10. In the timing diagram of FIG. 4 the generation of the cross-tie, Bloch-line pair is indicative of the significant amplitude signal representative of the storage of a "1" in the cross-tie wall memory system of FIG. 1 while the insignificant signal is indicative of the storage of a "0" in the cross-tie wall memory system of FIG. 1.

Figures 7C, 7D:
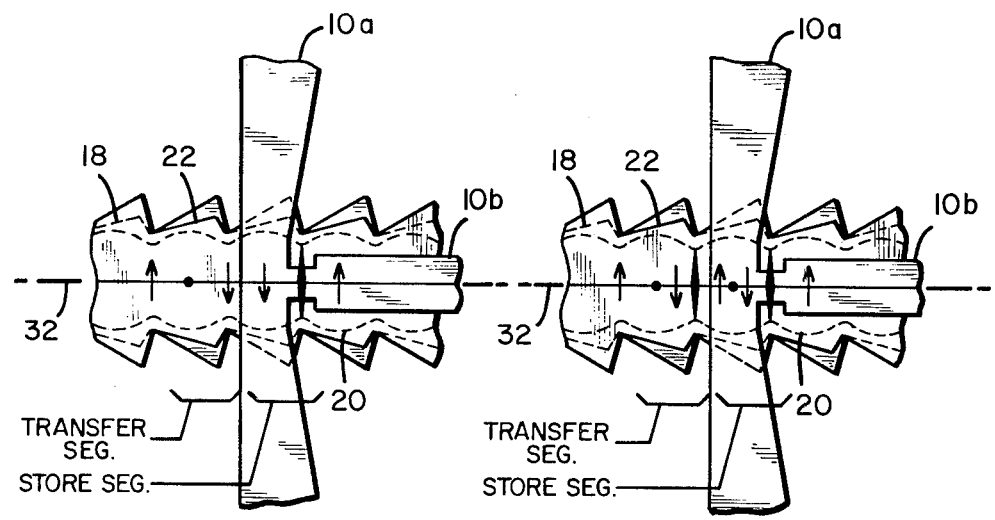

Next, at time $t_1$ with the Generate current signal terminated, generator 60 couples a Push current signal to stripline 18 via conductive line 18a. The Push current signal flows down stripline 18 to ground. This Push current signal "pushes" the Bloch-line in the store segment of the memory cell in generator 10 into the next adjacent downstream transfer segment thereof—this is as illustrated in FIG. 7c.

Next, at time $t_2$, with the Push current signal terminated, generator 61, via line 18a couples a Nucleate current signal to stripline 18. Nucleate current signal flows down stripline 18 to ground. This Nucleate current signal generates a new cross-tie, Bloch-line pair between the separated cross-tie, Bloch-line pair previously separated at time $t_1$—this is as illustrated in FIG. 7d.

Next, at time $t_3$, with the Nucleate current signal terminated, generator 62 couples an Annihilate current signal to stripline 18 via line 18a. The Annihilate current signal flows down stripline 18 to ground. This Annihilate current signal annihilates the cross-tie, Bloch-line pair resident in the store segment of the memory cell in generator 10—this is as illustrated in FIG. 7e. The cross-tie, Bloch-line pair generated in generator 10 in the store segment of the memory cell in generator 10 has now been propagated downstream into the associated transfer segment. Note that at this time a cross-tie, Bloch-line pair if previously, as at time $t_0$, in the store segment immediately upstream of detector 14 would now be in the transfer segment of detector 14 as illustrated in FIG. 7f.

Next, at time $t_4$, with the Annihilate current signal terminated, generator 36 couples a read current signal across conductive elements 14a and 14b of detector 14. The resulting readout signal on line 68 as detected by sense amplifier 67 and as gated by the Gate Detect signal on line 66 is a function of the magneto-resistive effect of the presence or absence of a cross-tie in the transfer segment of the memory cell in gap 15 of detector 14. As under the present assumed conditions, no cross-tie is present in the transfer section of the memory cell in detector 14 between conductive elements 14a and 14b, sense amplifier 67 detects a relatively high magneto-resistive condition providing a relatively insignificant "0" output signal on line 68.

Figure 7G:
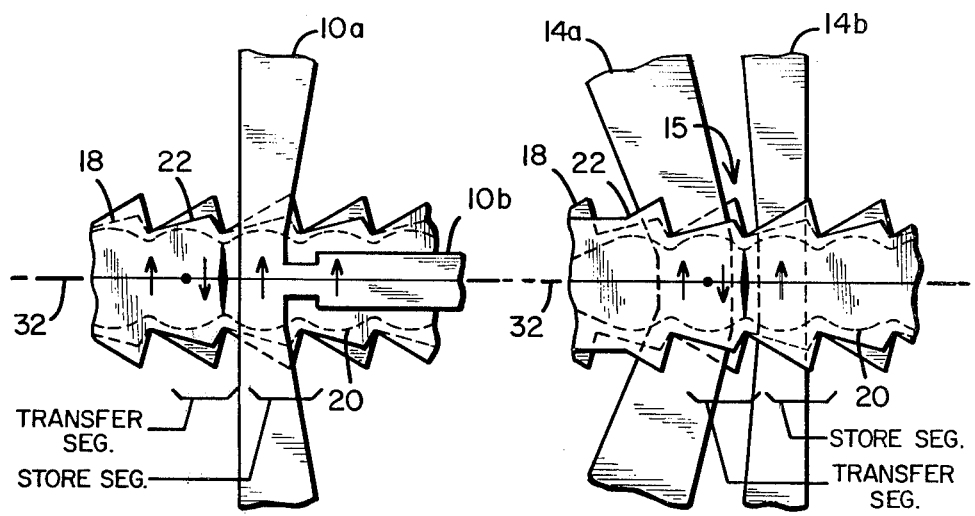
Figure 7G:
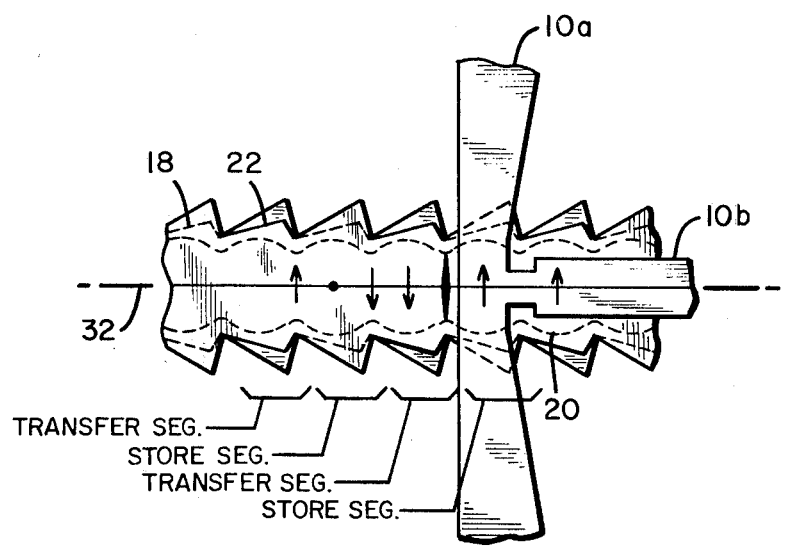

Next, at time $t_5$, with the read current signal from generator 36 terminated, generator 63 couples a Push current signal to stripline 22 via conductive element 22a. The Push current signal flows down stripline 22 to ground. This Push current signal "pushes" the Bloch-line in the transfer segment of the memory cell in generator 10 into the store segment of the next downstream memory cell—this is as illustrated in FIG. 7g.

Figure 7H:
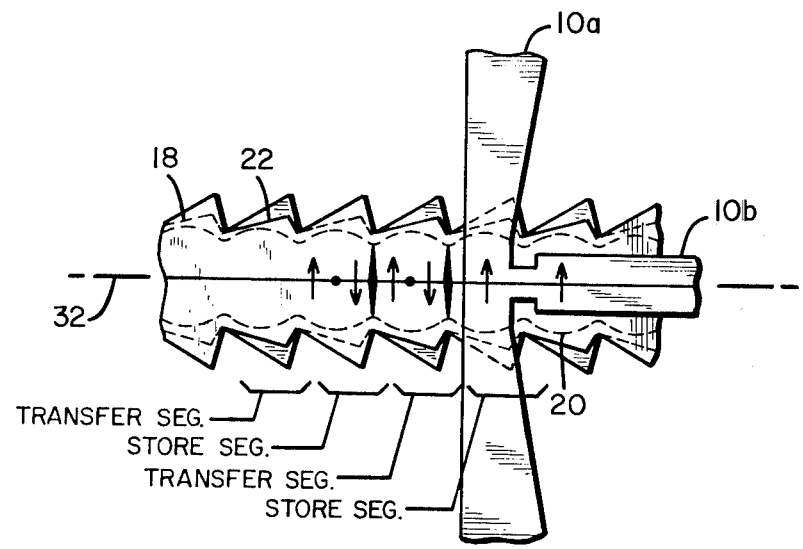

Next, at time $t_6$, with the Push current signal terminated, generator 64, via line 22a couples a Nucleate current signal to stripline 22. The Nucleate current signal flows down stripline 22 to ground. This Nucleate current signal generates a new cross-tie, Bloch-line pair between the separated cross-tie, Bloch-line pair previously separated at time $t_5$. This is as illustrated in FIG. 7h.

Figure 7I:
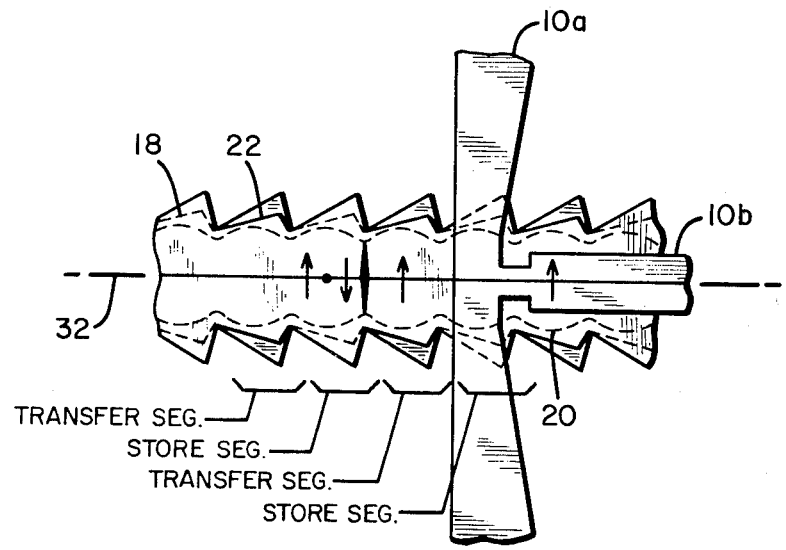

Next, at time $t_7$, with the Nucleate current signal terminated, generator 65 couples an Annihilate current signal to stripline 22 via line 22a. The Annihilate current signal flows down stripline 22 to ground. This Annihilate current signal annihilates the cross-tie, Bloch-line pair presently resident in the transfer segment of the memory cell in detector 14 leaving the now-propagated cross-tie, Bloch-line pair resident in the store segment of the next downstream memory cell from generator 10—this is as illustrated in FIG. 7i.

This push/nucleate/annihilate sequence continues propagating the cross-tie, Bloch-line pairs generated by generator 10 through the shift register 12 and into the detector 14—see FIG. 7f—from whence the information is read out in the manner as described above with particular reference to FIG. 4 at time $t_4$.

What is claimed is:

1. A magnetic shift register system comprising:
   first and second electrically conductive alternately wide-narrow edged stripline means having substantially similar, planar contours, the opposing edge conformations having mirror-edged contours of alternating relatively wide-narrow width segments forming like-length segments along the stripline's longitudinal axis of alternating relatively wide-narrow width segments about said longitudinal axis;
   magnetic data track means having opposing mirror-image edges about the longitudinal axis of said data track means;
   said first and second stripline means superposed and aligned along their superposed longitudinal axes with the wide-narrow width segments of said first stripline means superposed the narrow-wide width segments, respectively, of said second stripline means;
   said data track means inductively coupled to said first and second stripline means, the longitudinal axis of which is aligned with the aligned superposed longitudinal axes of said first and second stripline means; and,
   current signal source means coupling current signals to said first and second stripline means, respectively, for generating relatively strong-weak magnetic fields across the narrow-wide width segments, respectively, of said first and second stripline means and propagating data in said data track means therealong.

2. The system of claim 1 in which said first and second stripline means have substantially similar, planar serrated-edge conformations, the opposing serrated-edges having mirror-imaged, triangular edge contours of alternating relatively wide-narrow width peaks but of similar width valleys or necks therebetween forming serrated-edged sections along the stripline's longitudinal axis of alternating relatively wide-narrow segments.

3. The system of claim 2 in which said magnetic data track means has opposing serrated-edges which are formed by similar diameter overlapping circular disks, the joins of the overlapping circumferences of which form valleys or necks and the centers of which are aligned along the longitudinal axis of said data track means.

4. The system of claim 1 in which said current signal source means alternately couples first and second current signals to said first and second stripline means, respectively.

5. A cross-tie wall memory system comprising:
   first and second electrically conductive, alternately wide-narrow edged stripline means having substantially similar, planar edge conformations centered about their longitudinal axes for forming like-length segments along the stripline's longitudinal axis of alternating relatively wide-narrow width segments about said longitudinal axis;
   wide-narrow edged magnetic data track means having substantially similar planar edge conformations centered about its longitudinal axis for forming like-length segments along its longitudinal axis;
   said first and second stripline means aligned along their superposed longitudinal axes with the wide-narrow width segments of said first stripline means superposed the narrow-wide width segments, respectively, of said second stripline means;
   said data track means inductively coupled to said first and second stripline means, the longitudinal axis of which is aligned with the aligned superposed longitudinal axes of said first and second stripline means for orienting the narrow edge portions of said data track means and said first and second stripline means in phase alignment along their respective longitudinal axes; and,
   current signal source means coupling current signals to said first and second stripline means for generating relatively strong-weak magnetic fields along the narrow-wide width segments, respectively, of said first and second stripline means and propagating cross-tie, Bloch-line pairs in said data track means therealong.

6. A cross-tie wall memory system comprising:
   first and second electrically conductive serrated-edged stripline means having substantially similar, planar edge conformations, the opposing serrated-edges having mirror-edged, triangular edge contours of alternating relatively wide-narrow width peaks but of similar width valleys or necks therebetween forming serrated-edged sections along the stripline's longitudinal axis of alternating relatively wide-narrow width segments;
   serrated-edged magnetic data track means the opposing serrated-edges of which are formed by similar diameter overlapping circular disks, the joins of the overlapping circumferences of which form valleys or necks and the centers of which are aligned along the longitudinal axis of said data track means;
   said first and second stripline means superposed and aligned along their superposed longitudinal axes with the wide-narrow width segments of said first stripline means superposed the narrow-wide width segments, respectively, of said second stripline means;
   said data track means inductively coupled to said first and second stripline means, the longitudinal axis of which is aligned with the aligned superposed longitudinal axes of said first and second stripline means for orienting the necks of said data track means and said first and second stripline means in phase alignment along their respective longitudinal axes; and, current signal source means alternatively coupling first and second current signals to said first and second stripline means, respectively, generating relatively strong-weak magnetic fields along the narrow-wide width segments, respectively, of said first and second stripline means for propagating cross-tie, Bloch-line pairs in said data track means therealong.

7. A cross-tie wall memory system comprising:

first and second electrically conductive serrated-edged stripline means having substantially similar, planar edge conformations, the opposing serrated-edges having mirror-edged, triangular edge contours of alternating relatively wide-narrow width peaks but of similr width valleys or necks therebetween forming serrated-edged sections along the stripline's longitudinal axis of alternating relatively wide-narrow width segments;

serrated-edged magnetic data track means the opposing serrated-edges of which are formed by similar diameter overlapping circular disks, the joins of the overlapping circumferences of which form valleys or necks and the centers of which are aligned along the longitudinal axis of said data track means;

said first and second stripline means superposed and aligned along their superposed longitudinal axes with the wide-narrow width segments of said first stripline means superposed the narrow-wide width segments, respectively, of said second stripline means;

said data track means superposed said superposed first and second stripline means, the longitudinal axis of which is aligned superposed the aligned superposed longitudinal axes of said first and second stripline means for orienting the necks of said data track means and said first and second stripline means in phase alignment along their respective longitudinal axes; and, first and second current signal source means coupling first and second current signals to said first and second stripline means, respectively, for generating relatively strong-weak magnetic fields propagating cross-tie, Bloch-line pairs in said data track means therealong.

* * * * *